US010042028B2

(12) United States Patent
Jo et al.

(10) Patent No.: US 10,042,028 B2
(45) Date of Patent: Aug. 7, 2018

(54) MEDICAL IMAGING APPARATUS AND METHOD OF PROCESSING MEDICAL IMAGE

(71) Applicant: SAMSUNG ELECTRONICS CO., LTD., Suwon-si (KR)

(72) Inventors: Hyun-hee Jo, Osan-si (KR); Dae-hwan Kim, Suwon-si (KR); Joon-soo Kim, Seoul (KR); Sung-pil Jung, Yongin-si (KR); Yang-lim Choi, Seongnam-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 14/854,215

(22) Filed: Sep. 15, 2015

(65) Prior Publication Data
US 2016/0125596 A1 May 5, 2016

(30) Foreign Application Priority Data

Nov. 3, 2014 (KR) .................. 10-2014-0151211

(51) Int. Cl.
*G01R 33/56* (2006.01)
*G01R 33/563* (2006.01)
(Continued)

(52) U.S. Cl.
CPC ...... *G01R 33/5608* (2013.01); *G01R 33/4835* (2013.01); *G01R 33/546* (2013.01); *G01R 33/563* (2013.01)

(58) Field of Classification Search
CPC ... A61B 1/00045; A61B 5/742; A61B 5/7435; A61B 5/055; A61B 5/1107; A61B 6/463;
(Continued)

(56) References Cited

U.S. PATENT DOCUMENTS 7,603,154 B2 10/2009 Noble et al.
7,966,055 B2 6/2011 Guehring et al.
(Continued)

FOREIGN PATENT DOCUMENTS

WO 2005/046473 A1 5/2005
WO 2014165646 A1 10/2014

OTHER PUBLICATIONS

Yu, Hsi-Yu, Mao-Yuan Su, Ta-Yu Liao, Hsu-Hsia Peng, Fang-Yue Lin, and Wen-Yih Isaac Tseng. "Functional mitral regurgitation in chronic ischemic coronary artery disease: analysis of geometric alterations of mitral apparatus with magnetic resonance imaging." The Journal of thoracic and cardiovascular surgery 128, No. 4 (2004): 543-551.*
(Continued)

*Primary Examiner* — Carol Wang
(74) *Attorney, Agent, or Firm* — Sughrue Mion, PLLC

(57) ABSTRACT

A medical imaging apparatus includes: an output unit configured to display a magnetic resonance (MR) image matrix in which MR images, obtained by performing magnetic resonance imaging on a heart, are arranged in columns and rows; and an image processor configured to display at least one first indicator which indicates a column of the MR image matrix corresponding to at least one of end diastole and end systole and display at least one second indicator which indicates a row of the MR image matrix corresponding to at least one of an apex and a base of the heart, wherein the columns of the MR image matrix are arranged according to time when MR images included in the columns are captured, and the rows of the MR image matrix are arranged according to a position on a longitudinal axis of the heart corresponding to MR images included in the rows.

20 Claims, 12 Drawing Sheets

(51) Int. Cl.
*G01R 33/54* (2006.01)
*G01R 33/483* (2006.01)

(58) Field of Classification Search
CPC ......... A61B 6/503; A61B 8/461; A61B 8/463;
A61B 8/0883; A61B 2017/00243; A61B
2018/00351; A61B 2576/023; G06T
7/0012; G06T 7/174; G06T 7/38; G06T
2207/30048; G06T 2207/10016; G06T
2207/10088; G06T 2210/41; G06T
2200/24; G01R 33/5608; G01R 33/563;
G01R 33/4835; G01R 33/546; G09G
2354/00
See application file for complete search history.

(56) References Cited

U.S. PATENT DOCUMENTS

| | | | |
|---|---|---|---|
| 8,131,043 B2 | 3/2012 | Binkley et al. | |
| 2002/0082484 A1* | 6/2002 | Baba | A61B 6/00 600/300 |
| 2004/0153128 A1* | 8/2004 | Suresh | G06F 19/3437 607/14 |
| 2005/0113665 A1 | 5/2005 | Mohr et al. | |
| 2007/0073138 A1 | 3/2007 | Sprung | |
| 2007/0203412 A1* | 8/2007 | Sugiura | A61B 5/055 600/410 |
| 2007/0253609 A1 | 11/2007 | Aben | |
| 2008/0298682 A1 | 12/2008 | Cocosco et al. | |
| 2009/0290777 A1 | 11/2009 | Sun et al. | |
| 2013/0076783 A1* | 3/2013 | Goto | G09G 5/006 345/619 |
| 2014/0121496 A1 | 5/2014 | Bi et al. | |
| 2015/0015572 A1* | 1/2015 | Izumo | A61B 5/743 345/419 |
| 2015/0084959 A1* | 3/2015 | Nitta | A61B 5/055 345/427 |

OTHER PUBLICATIONS

Communication dated May 23, 2016, issued by the Korean Intellectual Property Office in corresponding Korean Application No. 10-2014-0151211.
Communication dated Sep. 24, 2015, issued by the International Searching Authority in counterpart International Application No. PCT/KR2015/006676 (PCT/ISA/210).
Siemens: "syngo MR D13 Operator Manual-Cardio", Jun. 1, 2012 (Jun. 1, 2012), XP055418366, Retrieved from the Internet: URL:cbbi.udel.edu/wp-content/uploads/2017/01/Cardio-1.pdf; pp. A-1-E-6.
Extended European Search Report in Application No. 15857791.6, dated Nov. 16, 2017.

* cited by examiner base apex

MEDICAL IMAGING APPARATUS AND METHOD OF PROCESSING MEDICAL IMAGE

RELATED APPLICATION

This application claims priority from Korean Patent Application No. 10-2014-0151211, filed on Nov. 3, 2014, in the Korean Intellectual Property Office, the disclosure of which is incorporated herein in its entirety by reference.

BACKGROUND

1. Field

One or more exemplary embodiments relate to a medical imaging apparatus and a method of processing a medical image, and more particularly, to a medical imaging apparatus and a method of processing a medical image, which extract desired images from among magnetic resonance (MR) images of an object.

2. Description of the Related Art

A magnetic resonance imaging (MRI) apparatus uses a magnetic field to obtain an image of an object, and is widely used for diagnosis of diseases because the MRI apparatus shows stereoscopic images of bones, lumbar discs, joints, nerve ligaments, the heart, and the like at desired angles. For a cardiac MRI, an MRI apparatus may obtain magnetic resonance (MR) images of the heart, which moves over time, at predetermined time intervals for analysis.

Medical imaging apparatuses are used to acquire images showing an internal structure of an object. The medical imaging apparatuses are non-invasive examination devices that capture and process images of structures, tissues, flow of fluid, etc., inside a body and provide the images to a user via a display. A user, e.g., a doctor may use medical images output from the medical imaging apparatuses to diagnose a patient's condition and disease.

In particular, since a left ventricle of the heart is responsible for delivering blood to the whole body, a heart disease may be diagnosed by analyzing images showing movement of the left ventricle over time.

However, determining movement of the left ventricle with the naked eye by analyzing a plurality of images is not only time consuming but also degrades accuracy of analysis. Thus, there is a need for a system for extracting images needed for analyzing a plurality of images for diagnosis of a heart disease and displaying the extracted images.

SUMMARY

One or more exemplary embodiments provide a medical imaging apparatus and a method of processing a medical image, which extract desired images from a plurality of cardiac images and provide a user with the extracted images.

Additional aspects will be set forth in part in the description which follows and, in part, will be apparent from the description, or may be learned by practice of the exemplary embodiments.

According to an aspect of an exemplary embodiment, a medical imaging apparatus includes: an output unit configured to display, on a first region of a screen, a magnetic resonance (MR) image matrix in which a plurality of MR images are arranged in columns and rows, the plurality of MR images being obtained by performing magnetic resonance imaging (MRI) on a heart; and an image processor configured to display at least one first indicator which indicates a column of the MR image matrix corresponding to at least one of end diastole and end systole and display at least one second indicator which indicates a row of the MR image matrix corresponding to at least one of an apex and a base of the heart, wherein the columns of the MR image matrix are arranged according to time when MR images included in the columns are captured, and the rows of the MR image matrix are arranged according to a position on a longitudinal axis of the heart, the position corresponding to MR images included in the rows.

The plurality of MR images may include first cross-sectional images on a lateral-axis of the heart.

The output unit may display, on a second region of the screen, at least one second cross-sectional image on the longitudinal-axis of the heart, the longitudinal axis being substantially perpendicular to the lateral-axis of the heart, and the at least one second cross-sectional image may correspond to at least one of the end diastole and the end systole.

The apparatus may further include an input unit configured to receive a user input for repositioning the at least one first indicator which indicates the column of the MR image matrix corresponding to at least one of end diastole and end systole, wherein the output unit is configured to reposition, based on the user input, the at least one first indicator.

The output unit may change the at least one second cross-sectional image displayed on the second region, based on the user input for repositioning the at least one first indicator.

The at least one first indicator may include an index for identifying at least one of an end-diastole column of the MR image matrix corresponding to the end-diastole and an end-systole column of the MR image matrix corresponding to the end-systole, and the user input for repositioning the at least one first indicator may include dragging the index for identifying the at least one of the end-diastole column and the end-systole column.

The image processor may display marks on the at least one second cross-sectional image displayed on the second region, the marks indicating positions, on the longitudinal axis of the heart, respectively corresponding to rows of the plurality of MR images included in the MR image matrix.

The input unit may receive a user input for repositioning one of the second indicator and a mark, the second indicator and the mark being displayed on the first and second regions, respectively, and the output unit may reposition at least one of the second indicator and the mark, based on the user input.

The user input for repositioning one of the second indicator and the mark may include a drag input.

The plurality of MR images included in the MR image matrix include MR images captured during a single cardiac cycle, and MR images in a row of the MR image matrix are captured at the same position on a lateral-axis of the heart at predetermined time intervals.

The output unit may enlarge at least one MR image, among the plurality of MR images in the MR image matrix, and display the enlarged at least one MR image on a third region of the screen.

According to an aspect of another exemplary embodiment, a method of processing a medical image includes: displaying, on a first region of a screen, a magnetic resonance (MR) image matrix in which a plurality of MR images are arranged in columns and rows, the plurality of MR images being obtained by performing magnetic resonance imaging (MRI) on a heart; displaying at least one first indicator which indicates a column of the MR image matrix corresponding to at least one of end diastole and end systole;

and displaying at least one second indicator which indicates a row of the MR image matrix corresponding to at least one of an apex and a base of the heart, wherein the columns of the MR image matrix are arranged according to time when MR images in the columns are captured, and the rows of the MR image matrix are arranged according to a position on a longitudinal axis of the heart, the position corresponding to MR images included in the rows.

The plurality of MR images may include first cross-sectional images on a lateral-axis of the heart.

The method further includes displaying, on a second region of the screen, at least one second cross-sectional image on the longitudinal axis of the heart, the longitudinal axis being substantially perpendicular to the lateral axis of the heart, wherein the at least one second cross-sectional image corresponds to at least one of the end diastole and the end systole.

The method may further include receiving a user input for repositioning the at least one first indicator which indicates the column of the MR image matrix corresponding to at least one of end diastole and end systole; and repositioning, based on the user input, the at least one first indicator.

The method may further include changing the at least one second cross-sectional image displayed on the second region, based on the user input for repositioning the at least one first indicator.

The displaying the at least one first indicator may include displaying an index for identifying at least one of an end-diastole column of the MR image matrix corresponding to the end-diastole and an end-systole column of the MR image matrix corresponding to the end-systole, and the user input for repositioning the at least one first indicator may include a drag input on the index for identifying the at least one of the end-diastole column and the end-systole column.

The method may further include displaying marks on the at least one second cross-sectional image displayed on the second region, the marks indicating positions on the longitudinal axis of the heart, the positions corresponding to rows of the plurality of MR images included in the MR image matrix.

The method may further include receiving a user input for repositioning one of the second indicator and a mark, the second indicator and the mark being displayed on the first and second regions, respectively; and repositioning, based on the user input, at least one of the second indicator and the mark.

The user input for repositioning one of the second indicator and the mark may include a drag input.

The plurality of MR images included in the MR image matrix include MR images captured during a single cardiac cycle, and MR images in a row of the MR image matrix may be captured at the same position on a lateral-axis at predetermined time intervals.

The method may further include enlarging at least one MR image, among the plurality of MR images in the MR image matrix, and displaying the enlarged at least one MR image on a third region of the screen.

According to an aspect of still another exemplary embodiment, provided is a non-transitory computer-readable recording medium having recorded thereon a program, which, when executed by a computer, causes the computer to execute the above method.

BRIEF DESCRIPTION OF THE DRAWINGS

The above and/or other aspects will become more apparent by describing certain exemplary embodiments with reference to the accompanying drawings.

DETAILED DESCRIPTION

Figure 1:
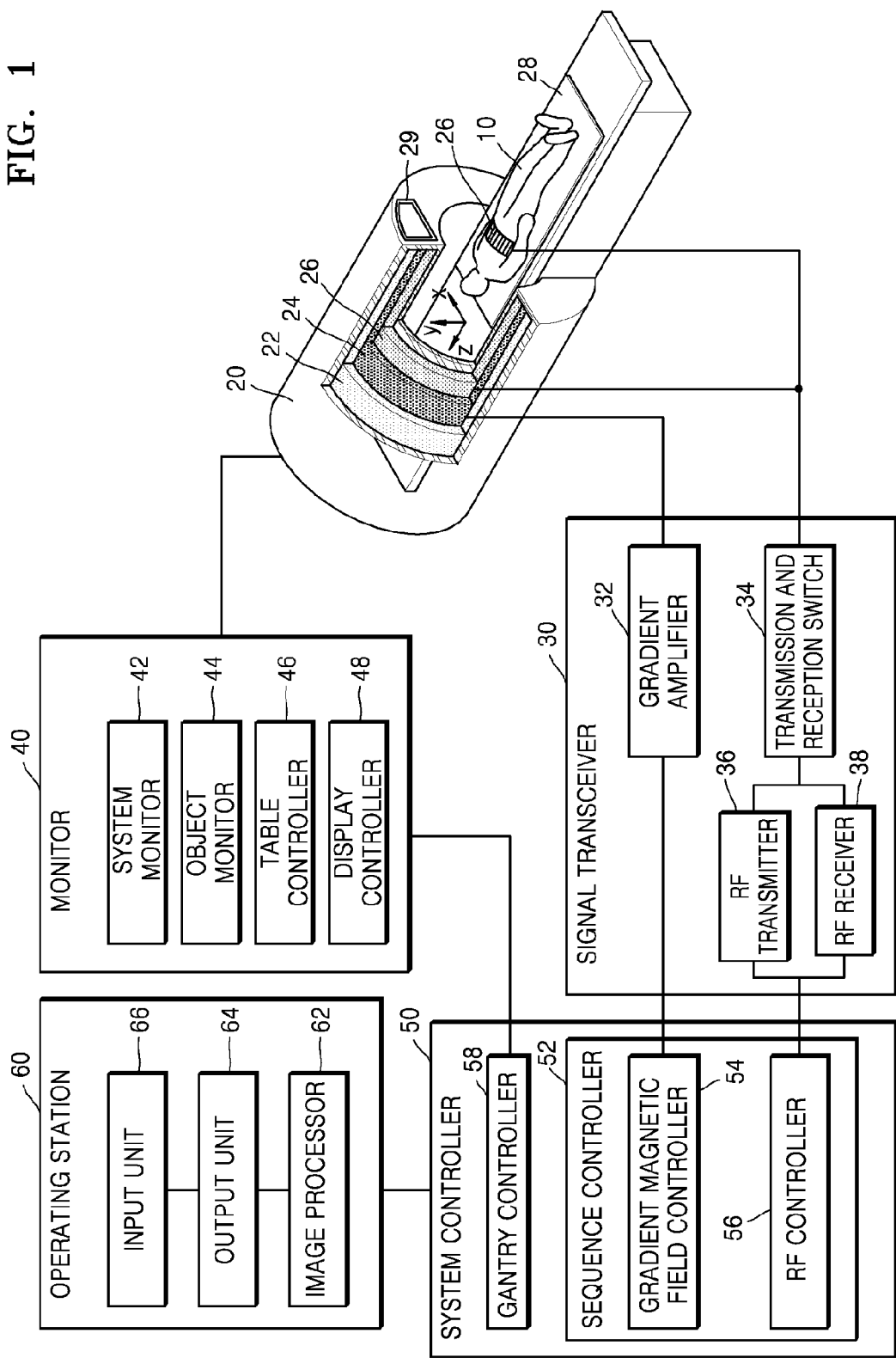
FIG. 1 is a block diagram of a general magnetic resonance imaging (MRI) system.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

The terms used in this specification are those general terms currently widely used in the art in consideration of functions regarding the exemplary embodiment, but the terms may vary according to the intention of those of ordinary skill in the art, precedents, or new technology in the art. Also, some terms may be arbitrarily selected by the applicant, and in this case, the meaning of the selected terms will be described in detail. Thus, the terms used herein have to be defined based on the meaning of the terms together with the description throughout the specification.

When a part "includes" or "comprises" an element, unless there is a particular description contrary thereto, the part can further include other elements, not excluding the other elements. Also, the term "unit" in the exemplary embodiments means a software component or hardware component such as a field-programmable gate array (FPGA) or an application-specific integrated circuit (ASIC), and performs a specific function. However, the term "unit" is not limited to software or hardware. The "unit" may be formed to be in an addressable storage medium, or may be formed to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units". Expressions such as "at least one of," when preceding a list of elements, modify the entire list of elements and do not modify the individual elements of the list.

Throughout the specification, an "image" may denote multi-dimensional data composed of discrete image elements (for example, pixels in a two-dimensional (2D) image and voxels in a three-dimensional (3D) image). For example, an image may be a medical image of an object acquired by an X-ray apparatus, a computed tomography (CT) apparatus, a magnetic resonance imaging (MRI) apparatus, an ultrasound diagnosis apparatus, or another medical imaging apparatus.

Furthermore, an "object" may be a human, an animal, or a part of a human or animal. For example, the object may be an organ (e.g., the liver, the heart, the womb, the brain, a breast, or the abdomen), a blood vessel, or a combination thereof. The object may be a phantom. The phantom means a material having a density, an effective atomic number, and a volume that are approximately the same as those of an organism. For example, the phantom may be a spherical phantom having properties similar to the human body.

Furthermore, a "user" may be, but is not limited to, a medical expert, such as a medical doctor, a nurse, a medical laboratory technologist, or a technician who repairs a medical apparatus.

Furthermore, an "MR image" refers to an image of an object obtained by using the nuclear magnetic resonance principle.

Furthermore, a "pulse sequence" refers to continuity of signals repeatedly applied by an MRI apparatus. The pulse sequence may include a time parameter of a radio frequency (RF) pulse, for example, repetition time (TR) or echo time (TE).

Furthermore, a "pulse sequence schematic diagram" shows an order of events that occur in an MRI apparatus. For example, the pulse sequence schematic diagram may be a diagram showing an RF pulse, a gradient magnetic field, a magnetic resonance (MR) signal, or the like according to time.

An MRI system is an apparatus for acquiring a sectional image of a part of an object by expressing, in a contrast comparison, a strength of a MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus the MRI system may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

MRI systems include characteristics different from those of other imaging apparatuses. Unlike imaging apparatuses such as CT apparatuses that acquire images according to a direction of detection hardware, MRI systems may acquire 2D images or 3D volume images that are oriented toward an optional point. MRI systems do not expose objects or examiners to radiation, unlike CT apparatuses, X-ray apparatuses, positron emission tomography (PET) apparatuses, and single photon emission CT (SPECT) apparatuses, may acquire images having high soft tissue contrast, and may acquire neurological images, intravascular images, musculoskeletal images, and oncologic images that are required to precisely capturing abnormal tissues.

FIG. 1 is a block diagram of a general MRI system. Referring to FIG. 1, the general MRI system may include a gantry 20, a signal transceiver 30, a monitor 40, a system controller 50, and an operating station 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being stronger and substantially uniform.

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 may emit an RF signal toward a patient and receive an MR signal emitted from the patient (or the object 10). In detail, the RF coil 26 may transmit, toward atomic nuclei included in the patient and having precessional motion, an RF signal having the same frequency as that of the precessional motion, stop transmitting the RF signal, and receive an MR signal emitted from the atomic nuclei included in the patient.

For example, to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. When electromagnetic waves generated by the RF coil 26 disappear, the atomic nucleus to which the electromagnetic waves were applied transits from the high energy state to the low energy state, thereby emitting electromagnetic waves having a Lamor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the object 10.

The RF coil 26 may include an RF transmit and receive coil having both a function of generating electromagnetic waves each having an RF that corresponds to a type of an atomic nucleus and a function of receiving electromagnetic waves emitted from an atomic nucleus. Alternatively, the RF coil 26 may include an RF transmit coil having a function of generating electromagnetic waves each having an RF that corresponds to a type of an atomic nucleus, and an RF receive coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object 10, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a transmit only coil, a receive only coil, or a transmit and receive coil according to methods of transmitting and receiving an RF signal.

The RF coil 26 may be an RF coil having various numbers of channels, such as 16 channels, 32 channels, 72 channels, and 144 channels.

The gantry 20 may further include a display 29 disposed outside the gantry 20 and a display (not shown) disposed inside the gantry 20. The gantry 20 may provide predetermined information to the user or the object 10 through the display 29 and the display disposed inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 may be controlled by a control signal output by an RF controller 56.

The monitor 40 may monitor or control the gantry 20 or devices mounted on the gantry 20. The monitor 40 may include a system monitor 42, an object monitor 44, a table controller 46, and a display controller 48.

The system monitor 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitor 44 monitors a state of the object 10. In detail, the object monitor 44 may include a camera for observing a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of a sequence controller 52. For example, during moving imaging of the object 10, the table controller 46 may continuously or discontinuously move the table 28 according to the sequence control of the sequence controller 52, and thus the object 10 may be imaged in a field of view (FOV) larger than that of the gantry 20.

The display controller 48 controls the display 29 disposed outside the gantry 20 and the display disposed inside the gantry 20. For example, the display controller 48 may control the display 29 and the display disposed inside the gantry 20 to be turned on or off, and may control a screen image to be output on the display 29 and/or the display disposed inside the gantry 20. Also, when a speaker is located inside or outside the gantry 20, the display controller 48 may control the speaker to be turned on or off, or may control sound to be output via the speaker.

The system controller 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating station 60. Here, the pulse sequence includes all information for controlling the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating station 60 may request the system controller 50 to transmit pulse sequence information while controlling an overall operation of the MRI system.

The operating station 60 may include an image processor 62 for receiving and processing the MR signal received by the RF receiver 38, an output unit 64, and an input unit 66.

The image processor 62 may process the MR signal received from the RF receiver 38 to generate MR image data of the object 10.

The image processor 62 receives the MR signal received by the RF receiver 38 and performs any one of various signal processes, such as amplification, frequency conversion, phase detection, low frequency amplification, and filtering, on the received MR signal.

The image processor 62 may arrange digital data in a K-space (for example, also referred to as a Fourier space or a frequency space) of a memory, and rearrange the digital data into image data via 2D or 3D Fourier transform.

The image processor 62 may perform a composition process or difference calculation process on image data if needed. The composition process may include an addition process on a pixel or a maximum intensity projection (MIP) process. The image processor 62 may store the rearranged image data and/or image data on which a composition process or a difference calculation process is performed, in a memory (not shown) or an external server.

The image processor 62 may perform any of the signal processes on the MR signal in parallel. For example, the image processor 62 may perform a signal process on a plurality of MR signals received by a multi-channel RF coil in parallel to rearrange the plurality of MR signals into image data.

The output unit 64 may output image data generated or rearranged by the image processor 62 to the user. The output unit 64 may also output information needed for the user to manipulate the MRI system, such as a user interface (UI), user information, or object information. Examples of the output units 64 may include a speaker, a printer, a cathode ray tube (CRT) display, a liquid crystal display (LCD), a plasma display panel (PDP), an organic light emitting diode (OLED) display, a field emission display (FED), a light emitting diode (LED) display, a vacuum fluorescent display (VFD), a digital light processing (DLP) display, a flat panel display (PFD), a three-dimensional (3D) display, a transparent display, and other various output devices known to one of ordinary skill in the art.

The user may input object information, parameter information, a scan condition, a pulse sequence, or information about image composition or difference calculation by using the input unit 66. The input unit 66 may be a keyboard, a mouse, a track ball, a voice recognizer, a gesture recognizer, a touch screen, or any one of other various input devices that are known to one of ordinary skill in the art.

The signal transceiver 30, the monitor 40, the system controller 50, and the operating station 60 are described as separate components in FIG. 1. However, some or all of these components may be implemented as a single component. Also, some or all of functions of the signal transceiver 30, the monitor 40, the system controller 50, and the operating station 60 may be performed by any one of these components or another component. For example, it is described the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitor 40, the system controller 50, and the operating station 60 may be connected to each other by wire or wirelessly, and when they are connected wirelessly, the MRI system may further include an apparatus (not shown) for synchronizing clock signals therebetween. Communication between the gantry 20, the RF coil 26, the signal transceiver 30, the monitor 40, the system controller 50, and the operating station 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are known to one of ordinary skill in the art.

Figure 2:
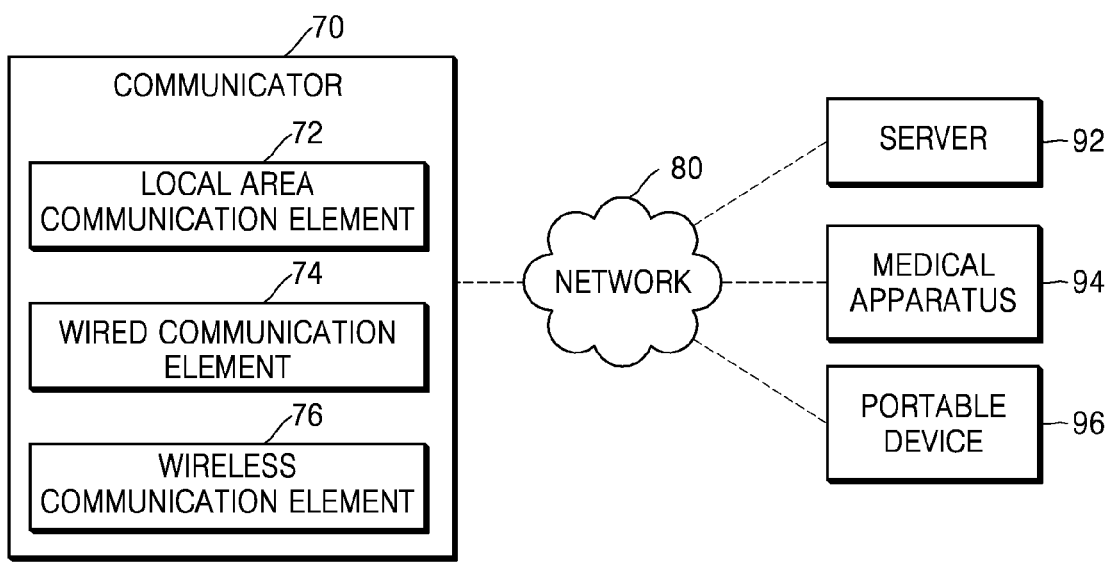
FIG. 2 is a block diagram of a communicator shown in FIG. 1.

FIG. 2 is a block diagram of a communicator 70. Referring to FIG. 2, the communicator 70 may be connected to at least one selected from the gantry 20, the signal transceiver 30, the monitor 40, the system controller 50, and the operating station 60 of FIG. 1.

The communicator 70 may transmit and/or receive data to and/or from a hospital server or another medical apparatus in a hospital, which is connected through a picture archiving and communication system (PACS), and perform data communication according to the digital imaging and communications in medicine (DICOM) standard.

As shown in FIG. 2, the communicator 70 may be connected to a network 80 by wire or wirelessly to communicate with a server 92, a medical apparatus 94, or a portable device 96.

For example, the communicator 70 may transmit and/or receive data related to the diagnosis of an object through the network 80, and may also transmit and/or receive a medical image captured by the medical apparatus 94, such as a CT apparatus, an MRI apparatus, or an X-ray apparatus. In addition, the communicator 70 may receive a diagnosis history or a treatment schedule of the object from the server 92 and use the same to diagnose the object. The communicator 70 may perform data communication with the server 92 or the medical apparatus 94 in a hospital, and/or with the portable device 96, such as a mobile phone, a personal digital assistant (PDA), or a laptop of a user, e.g., a doctor or patient.

Also, the communicator 70 may transmit information about a malfunction of the MRI system or about a medical image quality to a user through the network 80, and receive a feedback regarding the information from the user.

The communicator 70 may include at least one component enabling communication with an external apparatus.

For example, the communicator 70 may include a local area communication element 72, a wired communication element 74, and a wireless communication element 76. Examples of local area communication techniques according to an exemplary embodiment may include, but are not limited to, wireless LAN, Wi-Fi, Bluetooth, ZigBee, Wi-Fi Direct (WFD), ultra wideband (UWB), infrared data association (IrDA), Bluetooth low energy (BLE), and near field communication (NFC).

The wired communication element 74 refers to an element for performing communication by using an electric signal or an optical signal. Examples of wired communication techniques using a pair cable, a coaxial cable, and an optical fiber cable, and other known wired communication techniques.

The wireless communication element 76 transmits and/or receives a wireless signal to and/or from at least one selected from a base station, an external apparatus, and a server in a mobile communication network. Here, the wireless signal may be a voice call signal, a video call signal, or data in any one of various formats according to transmission and/or reception of a text and/or multimedia message.

Figure 3A:
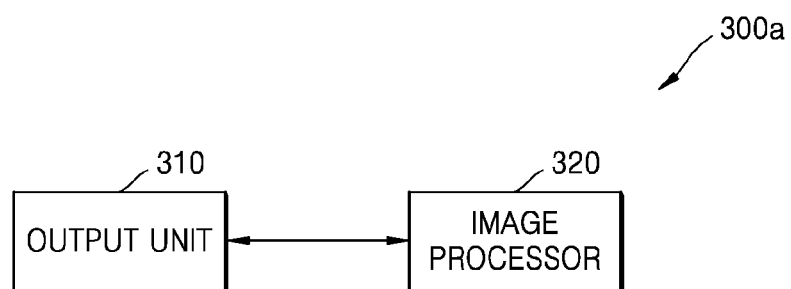
FIG. 3A illustrates a medical imaging apparatus according to an exemplary embodiment.

FIG. 3A illustrates a medical imaging apparatus 300a according to an exemplary embodiment.

The medical imaging apparatus 300a of FIG. 3A may be an apparatus for processing an MR image.

Referring to FIG. 3A, the medical imaging apparatus 300a may include an output unit 310 and an image processor 320.

The output unit 310 may display at least a part of an MR image matrix in which a plurality of MR images obtained by performing MRI of the heart are arranged on a first region of a screen.

In this case, an 'MR image matrix' may be a set of MR images that are arranged in a matrix to facilitate diagnosis via a plurality of cardiac MR images. Images in each column of an MR image matrix are arranged time-sequentially, based on the order in which each image was captured. Rows in the MR image matrix may be arranged according to position along a longitudinal axis of the heart. The 'MR image matrix' will be described in more detail below with reference to FIG. 5.

Figure 6A:
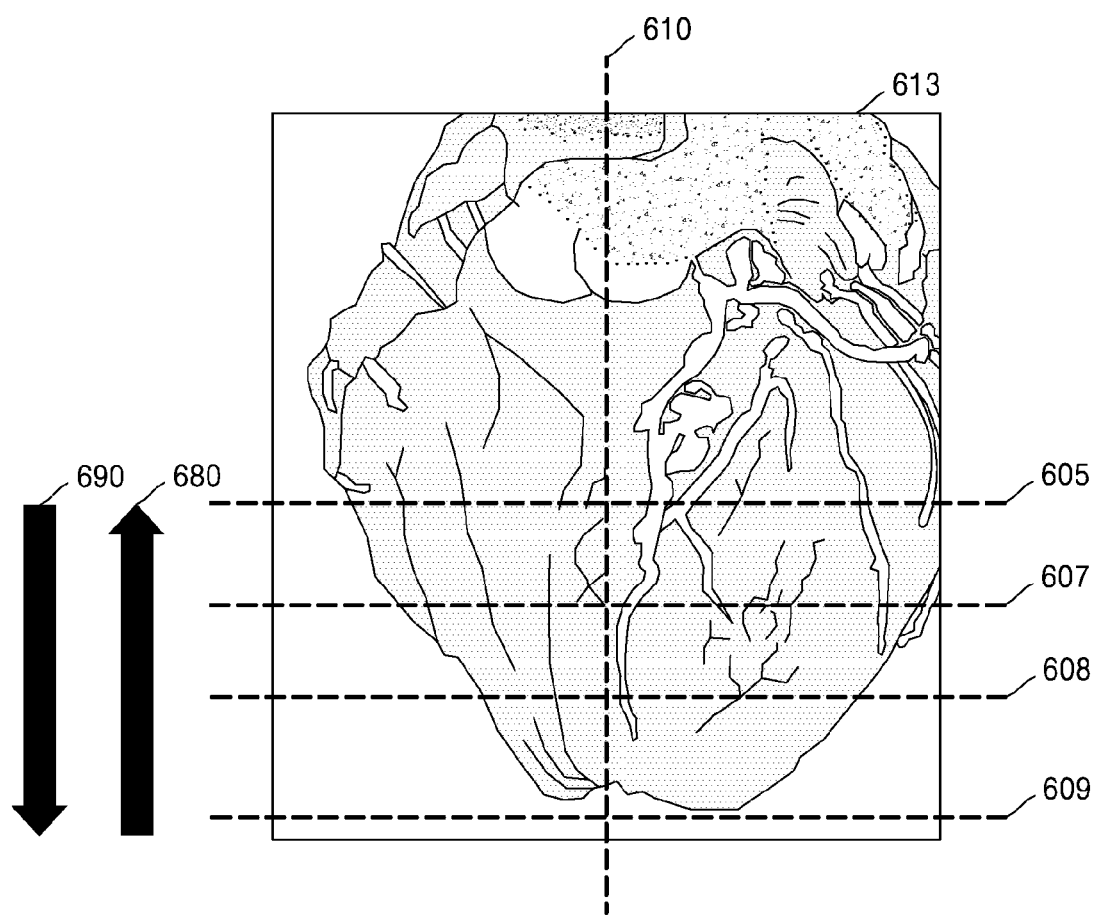
FIG. 6A illustrates a part of the heart related to an exemplary embodiment.
Figure 6B:
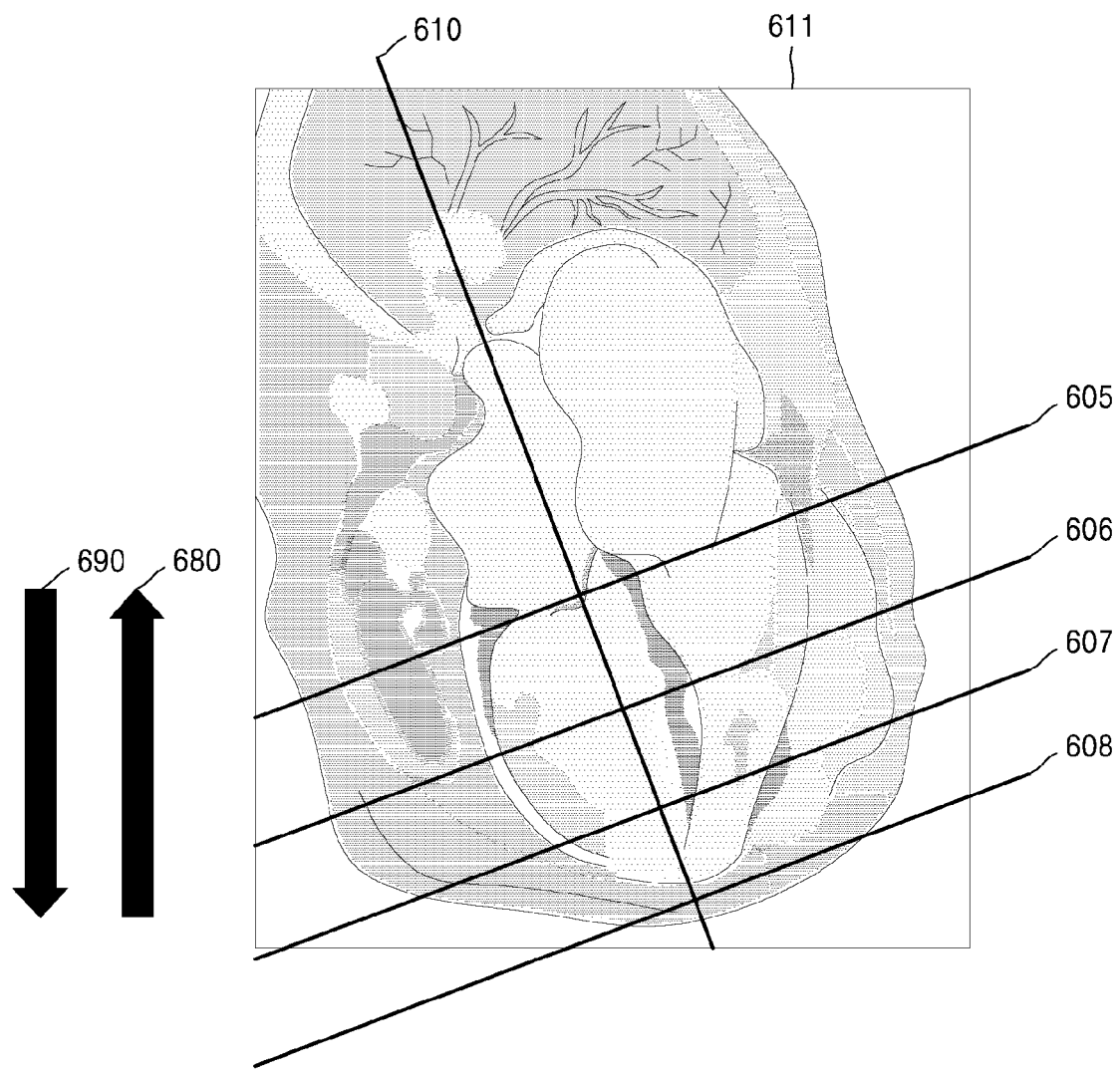
FIG. 6B illustrates a longitudinal axis image of the heart according to an exemplary embodiment.

A 'longitudinal axis' of the heart may be a line extending from a spleen to the right shoulder. FIG. 6B shows a direction of a longitudinal axis 610 in a cross-sectional image 611 of the heart including the longitudinal axis 610.

The output unit 310 may include the output unit 64 shown in FIG. 1.

The image processor 320 shown in FIG. 3A may be configured to display a column in an MR image matrix including MR images corresponding to at least one of end systole and end diastole, on a first region of a screen. The end diastole of the heart a time point when ventricles of the heart are fully relaxed. The end systole is a time point when the ventricles are fully contracted.

The image processor 320 may also be configured to indicate, for example, by using a mark, a column in the MR image matrix, which includes MR images of the apex of the heart, and a column in the MR image matrix, which includes MR images of the base of the heart. The base of the heart is a portion containing atria and large blood vessels, and the apex of the heart is a portion that protrudes towards a lower part of the stomach. Referring to FIG. 6A, an apex is located near a ventricle of the heart.

The image processor 320 shown in FIG. 3A may include the image processor 62 shown in FIG. 1.

As described above, according to an exemplary embodiment, the image processor 320 is configured to indicate images representing end diastole, end systole, an apex, and a base of the heart in an MR image matrix by, for example, using marks.

Images representing end diastole, end systole, an apex, and a base of the heart may be important for diagnosing the heart disease. For example, since a cross-sectional image of a part of the heart between the apex and base thereof may be used to analyze a function of the heart, positions of the base and apex may need to be determined before diagnosing the heart.

Furthermore, partial volumes at end diastole and end systole in a cardiac cycle may be used to calculate important clinical parameters such as ejection fraction, an end-diastole volume, an end-systole volume, and the like. Thus, images corresponding to end diastole and end systole during diagnosis of the heart may be needed.

Thus, according to an exemplary embodiment, diagnosis may be facilitated by using images included in an MR image matrix and indicated as end diastole, end systole, an apex, and a base of the heart.

Figure 3B:
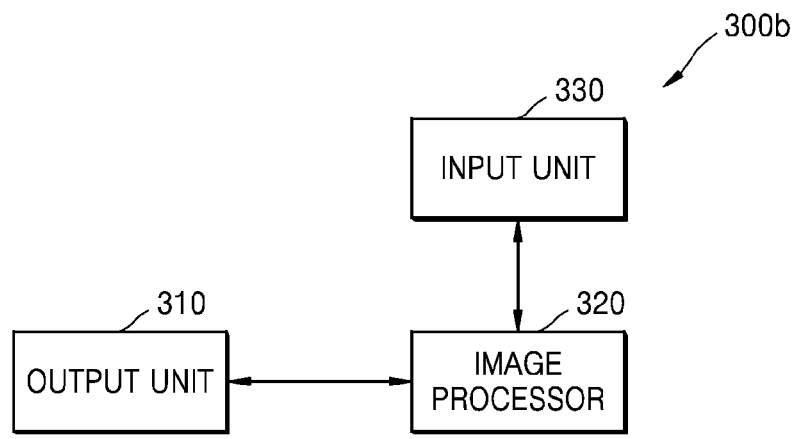
FIG. 3B illustrates a medical imaging apparatus according to another exemplary embodiment.

FIG. 3B illustrates a medical imaging apparatus 300b according to another exemplary embodiment.

Referring to FIG. 3B, the medical imaging apparatus 300b according to another exemplary embodiment may include an output unit 310, an image processor 320, and an input unit 330. The output unit 310 and the image processor 320 have substantially the same or similar configuration as those described above in FIG. 3A, a detailed description thereof is omitted.

The input unit 330 may be a device via which data for controlling the medical imaging apparatus 300b is input.

According to an exemplary embodiment, the input unit 330 may receive a user input for modifying at least one of indicators, which are displayed on the first region of the screen, representing an end diastole column and an end-systole column in an MR image matrix respectively corresponding to end diastole and end systole.

The input unit 330 may also receive a user input for repositioning marks on MR images of an apex and a base of the heart in each column of an MR image matrix.

The user input may include inputs for repositioning indicators representing end diastole and end-systole columns and/or inputs for repositioning marks indicating images of an apex and a base, but is not limited thereto.

According to an exemplary embodiment, a user input for repositioning indicators identifying an end diastole column and/or an end-systole column may be performed by dragging an index for identifying at least one of the end diastole column and the end-systole column.

Furthermore, a user input for repositioning a mark indicating an image of one of an apex and a base of the heart may be performed by dragging a mark from one image to another image.

The input unit 330 may further include a keypad, a dome switch, a touchpad (a capacitive overlay type, a resistive overlay type, an infrared beam type, a surface acoustic wave type, an integral strain gauge type, a piezoelectric type, etc.), a jog wheel, and a jog switch. When a display panel and a touch pad form a layered structure, the layered structure may be referred to as a touch screen.

The touch screen may be configured to detect an actual touch by a pointer on a screen and/or a proximity touch where the pointer approaches the screen but separated from the screen by a predetermined distance. The term 'pointer' means a tool for touching a particular portion on or near the screen. Examples of the pointer may include a stylus pen and a body part such as fingers.

Various sensors may be disposed within or near the touch screen to sense a touch on the touch screen or a proximity screen. A tactile sensor is an example of the sensors for sensing a touch on the touch screen. The tactile sensor is used to sense a touch by a particular object to the same or greater degree by which a human can sense the touch. The tactile sensor may detect various information including the roughness of a contact surface, the hardness of the particular object, and the temperature of a touch point.

A proximity sensor is another example of the sensors for sensing a touch. The proximity sensor refers to a sensor that senses an object that is approaching or is located near a contact surface without any mechanical contact by using the force of an electromagnetic field or infrared light. Examples of the proximity sensor include a transmissive photoelectric sensor, a direct reflective photoelectric sensor, a mirror reflective photoelectric sensor, a high-frequency oscillation proximity sensor, a capacitive proximity sensor, a magnetic proximity sensor, and an infrared proximity sensor.

Examples of a user's touch gesture may include a tap, a touch and hold, a double-tap, a drag, a fanning, a flick, a drag and drop, and a swipe.

The input unit 330 may include the input unit 66 of FIG. 1.

In addition, although it is described above that a medical imaging apparatus is an apparatus for processing an MR image, the medical imaging apparatus may be an apparatus for processing images acquired by CT, X-ray, PET, and SPECT apparatuses. Furthermore, the medical imaging apparatus 300a of FIG. 3A or 300b of FIG. 3B may be the external server 92, the external medical apparatus 94, or the external portable device 96. In this case, the medical imaging apparatus 300a or 300b may be connected to the communicator 70 shown in FIG. 2 for operation.

Although an apparatus and a method of processing an MR image according to exemplary embodiments are described hereinafter, images described in exemplary embodiments are not limited to MR images.

Figure 4:
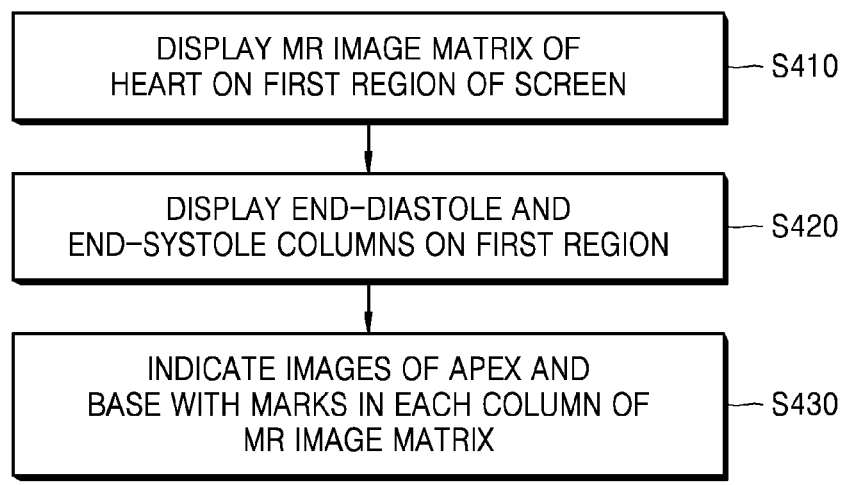
FIG. 4 is a flowchart of a method of processing a medical image according to an exemplary embodiment.

FIG. 4 is a flowchart of a method of processing a medical image according to an exemplary embodiment.

Referring to FIG. 4, the medical imaging apparatus 300a or 300b displays at least a part of an MR image matrix in which a plurality of MR images obtained by performing MRI of the heart are arranged on a first region on a screen (S410).

Figure 5:
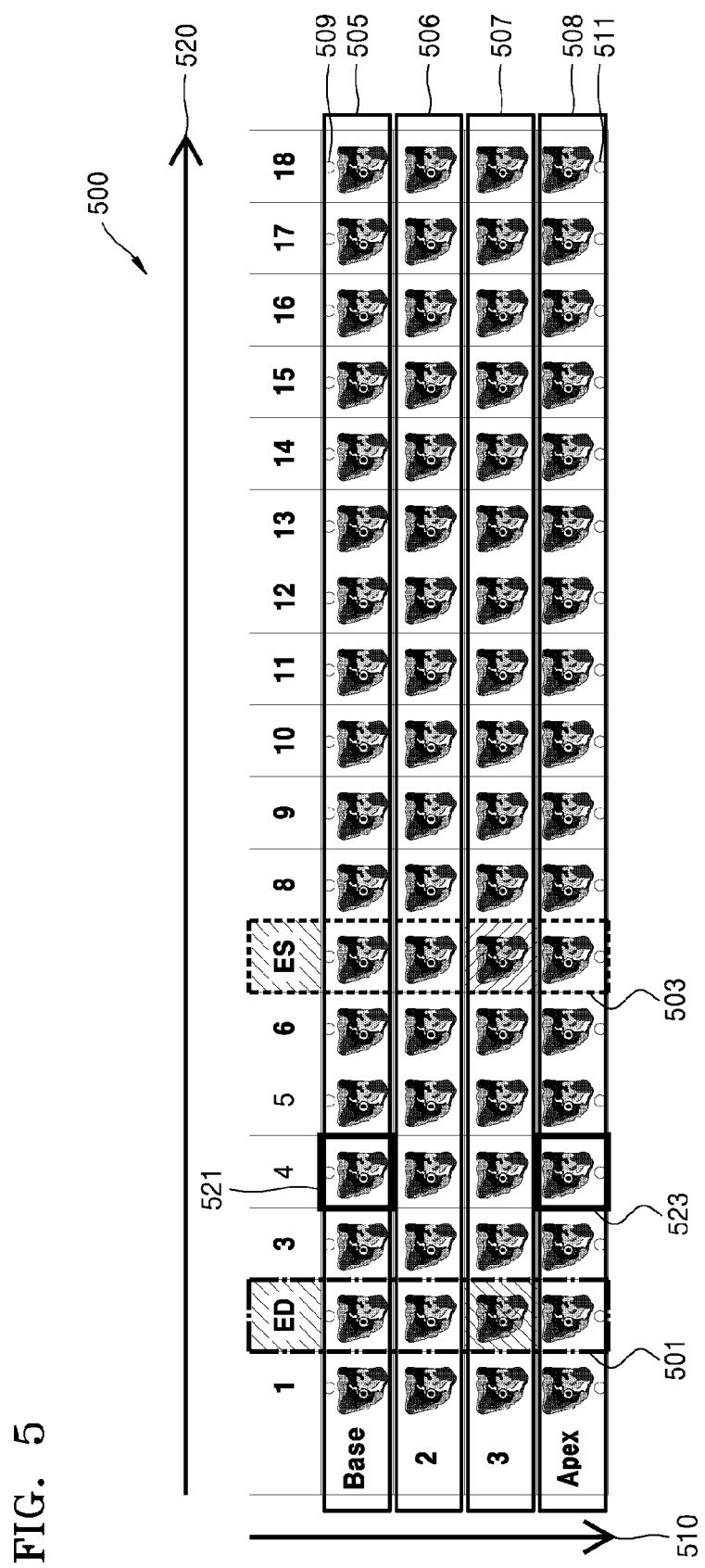
FIG. 5 illustrates a first region on a screen for processing a medical image according to an exemplary embodiment.

FIG. 5 illustrates displaying of at least a part of an MR image matrix on a first region 500 of a screen according to an exemplary embodiment.

Images displayed on the first region 500 may be cine MR images. Cine images include long-axis (or longitudinal-axis) or short-axis (or lateral-axis) cross-sectional images arranged in a time sequential manner and are used to detect movement of a left ventricle of the heart. In general, functional abnormality of the heart is determined using 200 to 400 pieces of image data in the cine images.

An MR image matrix displayed on the first region 500 includes short-axis cross-sectional images of the heart. A short-axis cross-sectional image shows a cross-section that is perpendicular to a longitudinal axis cross-section. FIG. 6A shows a short-axis cross-section 613 of the heart that is perpendicular to a longitudinal axis cross-section 611, as shown in FIG. 6B.

Referring to FIG. 5, columns may be arranged in a horizontal direction 520 of an MR image matrix in a time sequential manner. Rows may be arranged according to a location on a longitudinal axis of the heart in a vertical direction 510 of the MR image matrix. In other words, each column may include images captured at the same time, and each row may include images captured at the same location.

The columns in the MR image matrix may be arranged in the horizontal direction 520 in order of scanning time.

The columns may include images captured during a single cardiac cycle. In other words, images captured during the period of time when the heart in a fully relaxed state contracts and then returns to a relaxed state may be arranged time-sequentially along the horizontal direction 520.

According to an exemplary embodiment, an end-diastole column 501 representing images captured during end diastole and an end-systole column 503 representing images captured during end systole may be displayed on the first region 500. The end-diastole column 501 contains short-axis cross-sectional images of the heart captured at end diastole, and the short-axis cross-sectional images may be arranged in order of position on a longitudinal axis of the heart. The end systole column 503 includes short-axis cross-sectional images of the heart captured at end systole and the short-axis cross-sectional images may be arranged in order of their positions on a longitudinal axis of the heart.

Next, rows in the MR image matrix may be arranged in the vertical direction 510 in order of position on a longitudinal axis of the heart.

The rows may include short-axis cross-sectional images representing cross-sections of the heart from a base to an apex. A first row 505 that is a base row includes short-axis cross-sectional images corresponding to the base of the heart. A fourth row 508 that is an apex row includes short-axis cross-sectional images corresponding to the apex of the heart.

FIG. 5 shows that the cross-sections of the heart from the base to the apex are arranged in the vertical direction 510 from top to bottom. Alternatively, the cross-sections from the base to the apex may be arranged from bottom to top, with the base row at the bottom and the apex row at the top.

A position on a longitudinal axis will now be described in detail with reference to FIG. 6B. FIG. 6B illustrates a longitudinal axis cross-sectional image showing a cross-section including the longitudinal axis 610 of the heart. FIG. 6B also indicates positions 605 through 608 of slices corresponding to short-axis cross-sections perpendicular to the longitudinal axis 610. The image processor 320 may acquire MR images representing the short-axis cross-sections respectively corresponding to the slices at the positions 605 through 608.

The MR images may be sequentially arranged in the MR image matrix in an order from a cross-section of the slice at the position 605 to a cross-section of the slice at the position 608, i.e., in the order indicated by an arrow 690. As described above, MR images of cross-sections from the base to the apex may be arranged in a reverse order, i.e., an order indicated by an arrow 680.

According to an exemplary embodiment, the first row 505 shown in FIG. 5 that is a base row may include images showing the short-axis cross-section corresponding to the slice at the position 605. The next row, i.e., a second row 506 may include images showing the short-axis cross-section corresponding to the slice at the position 606. A subsequent row, i.e., a third row 507, may include images showing the short-axis cross-section corresponding to the slice at the position 607. The fourth row 508 that is an apex row next to the third row 507 may include images showing the short-axis cross-section corresponding to the slice at the position 608.

Figure 6C:
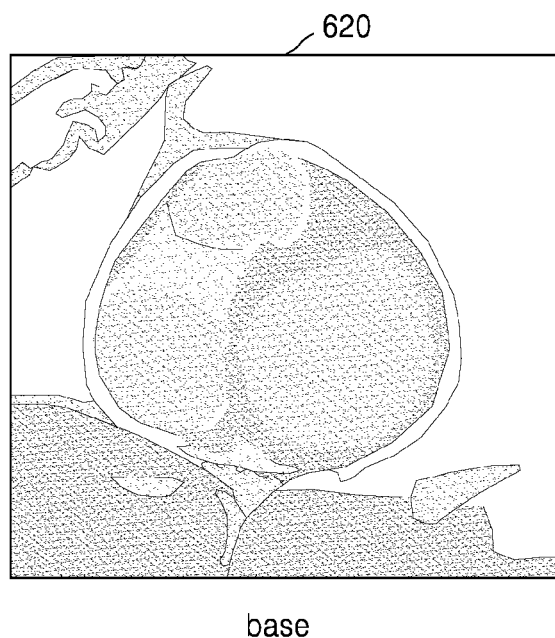
FIG. 6C illustrates an image of a base among short-axis images of the heart according to an exemplary embodiment.

FIG. 6C illustrates an image 620 of a base obtained by enlarging an image 521 included in the first row 505. The image 620 of the base may show the short-axis cross-section corresponding to the slice at the position 605.

Figure 6D:
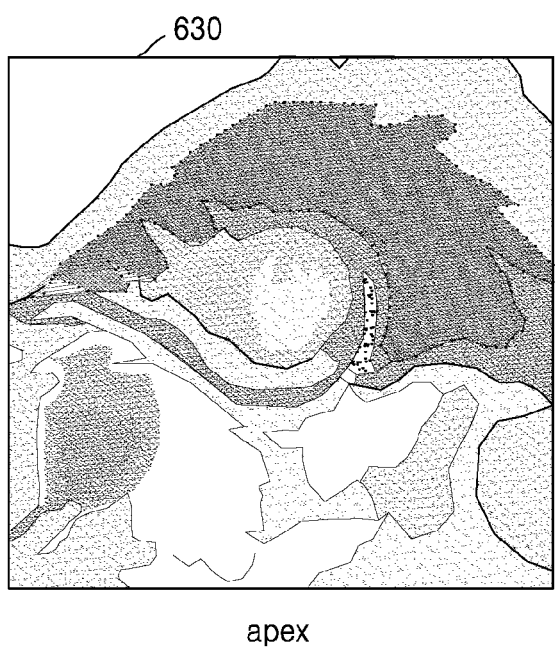
FIG. 6D illustrates an image of an apex among short-axis images of the heart according to an exemplary embodiment.

FIG. 6D illustrates an image 630 of an apex obtained by enlarging an image 523 included in the fourth row 508. The image 630 of the apex may show the short-axis cross-section corresponding to the slice at the position 608.

Referring back to FIG. 4, the medical imaging apparatus 300a or 300b may display a column of the MR image matrix representing at least one of end diastole and end systole on the first region of the screen (S420).

Referring back to FIG. 5, the end-diastole column 501 representing images captured during end diastole of the heart and the end-systole column 503 representing images captured during end systole may be automatically indicated by respective indexes ED and ES in the first region 500 of the screen.

The end-diastole column 501 may be indicated by an index ED representing end diastole, and the end-diastole column 503 may be indicated by an index ES representing end systole. Although the indices are respectively denoted as ED and ES at top of end-diastole column 501 and the end-systole column 503, the indices are not limited thereto and may have other various forms.

The medical imaging apparatus 300a or 300b may indicate with a mark at least one of MR images of the apex and the base of the heart in each column of the MR image matrix displayed on the first region (S430).

Referring to FIG. 5, for example, at least one of a mark 511 representing MR images of the apex of the heart in the MR image matrix and a mark 509 representing MR images of the base of the heart may be automatically indicated.

The marks 509 and 511 may have different forms. Furthermore, MR images may be indicated by contour lines, instead of marks 509 and 511. The marks 509 and 511 are not limited thereto and may have various forms as long as the marks distinctly indicate MR images of the apex and MR images of the base among the MR images displayed in the first region 500.

As another example, as shown in FIG. 5, the fourth row 508 in the MR image matrix, i.e., an apex row may be indicated by an index "Apex". Similarly, the first row 505, i.e., a base row may be indicated by an index "Base".

Figure 7:
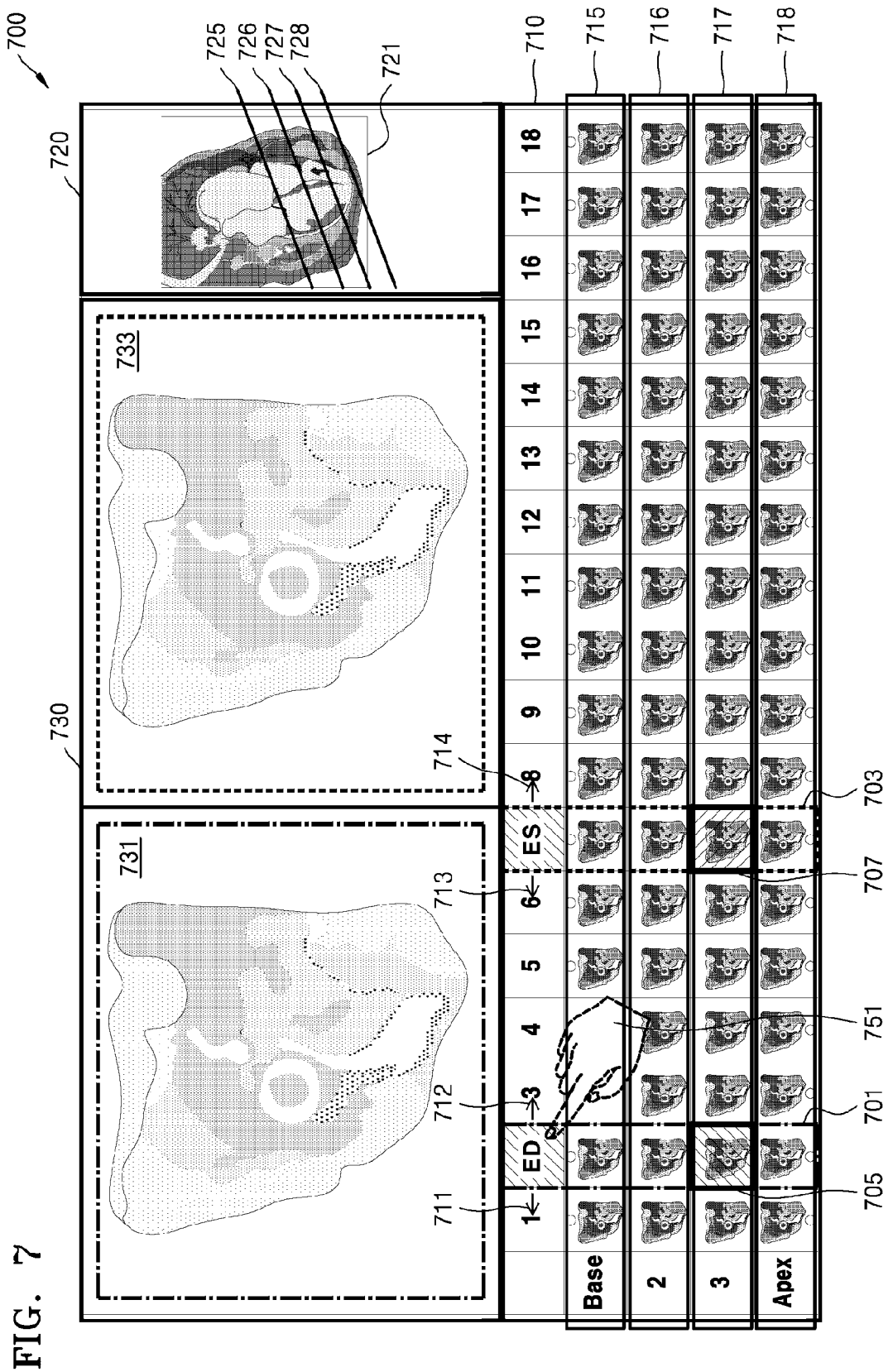
FIG. 7 illustrates a screen for processing a medical image according to an exemplary embodiment.

FIG. 7 illustrates a screen 700 for processing a medical image according to an exemplary embodiment.

Referring to FIG. 7, the screen 700 may be divided into a first region 710 for displaying an MR image matrix, a second region 720, and a third region 730. The second region 720 may display at least one longitudinal axis cross-sectional image 721 showing a cross-section on a longitudinal axis of the heart. The at least one longitudinal axis cross-sectional image 721 may correspond to one of a plurality of rows in the MR image matrix.

If a user selection 751 selects an index ED representing a second column 701 that is an end-diastole column, the longitudinal axis cross-sectional image 721 corresponding to short-axis cross-sectional images contained in the second column 701 may be displayed on the second region 720.

Similarly, if the user selection 751 selects an index ES representing a seventh column 703 that is an end-systole column, the longitudinal axis cross-sectional image 721 corresponding to short-axis cross-sectional images contained in the seventh column 703 may be displayed on the second region 720.

Although FIG. 7 shows that one longitudinal axis cross-sectional image 721 is displayed on the second region 720, two or more longitudinal axis cross-sectional images may be displayed on the second region 720. For example, two-chamber and four-chamber longitudinal axis cross-sectional images may be displayed together on the second region 720. In this case, if it is difficult to diagnose a desired part of the heart using the two-chamber longitudinal axis cross-sectional image, diagnosis may be made by using the four-chamber longitudinal axis cross-sectional image.

In addition, positions 725 through 728 of slices corresponding to short-axis cross-sections represented by short-axis cross-sectional images contained in first through fourth rows 715 through 718, respectively, may be indicated in the longitudinal axis cross-sectional image 721. In detail, the slice at the position 725 may correspond to a cross-section shown as short-axis cross-sectional images contained in the first row 715 that is a base row. The slices at the positions 726 and 727 may correspond to cross-sections shown as short-axis cross-sectional images contained in the second and third rows 716 and 717, respectively. The slice at the position 728 may correspond to a cross-section shown as short-axis cross-sectional images contained in the fourth row 718 that is an apex row.

Images 731 and 733 obtained by enlarging at least one of the images in the MR image matrix may be displayed on the third region 730 on the screen 700. The image 731 may correspond to an image 705 contained in the second column 701 that is an end-diastole column in the MR image matrix. Furthermore, the image 733 may correspond to an image 707 contained in the seventh column 703 that is an end-systole column in the MR image matrix.

The user selection 751 may select an image from among the images in the MR image matrix to be displayed in the third region 730 of the screen 700. Furthermore, images indicated by marks (e.g., 509 and 511 of FIG. 5) may be displayed time-sequentially in the third region 730.

For example, the image 731 on the third region 730 may be contained in the first row 715 that is a base row and may include the images that are indicated by the marks and displayed sequentially. Furthermore, the image 733 on the third region 730 may be contained in the fourth row 718 that is an apex row and may include the images that are indicated by the marks and displayed sequentially.

According to an exemplary embodiment, images representing end diastole, end systole, an apex, and a base may be automatically displayed in an MR image matrix on a first region of a screen. Thus, a user may promptly analyze desired images (e.g., clinically important images), and thus, the time taken to determine heart muscles and analyze the desired images may be reduced.

Since positions of slices corresponding to short-axis cross-sections shown as images in the MR image matrix are indicated on a second region on the screen, the user may more easily identify the positions of the apex and base of the heart.

Furthermore, the user may enlarge images indicated by marks in the MR image matrix through user selection on the images, thereby reducing the amount of time for analyzing the images and allowing for more precise diagnosis.

The user may reposition an indicator (e.g., index ED) for identifying an end-diastole column by moving the indicator identifying the end-diastole column to a left direction 711 or a right direction 712. In the same manner, the user may reposition an indicator (e.g., index ES) of an end-systole column by moving the indicator of the end-systole column to a left direction 713 or a right direction 714. Thus, the accuracy of automatically extracted images may be further increased by a user's modification.

Figure 8:
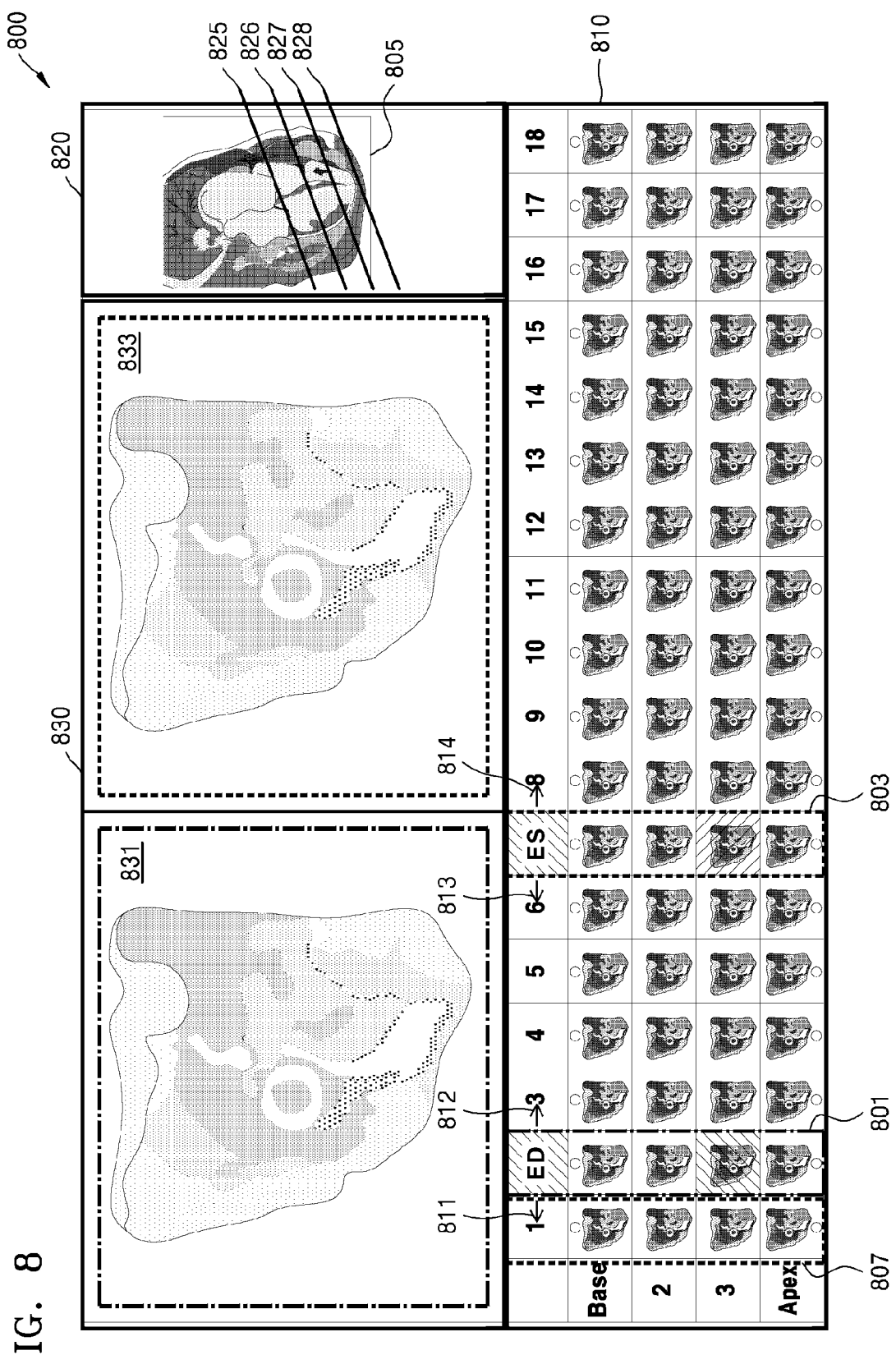
FIG. 8 illustrates a screen for processing a medical image according to another exemplary embodiment.

FIG. 8 illustrates a screen 800 for processing a medical image according to another exemplary embodiment.

Referring to FIG. 8, the screen 800 may be divided into a first region 810 for displaying an MR image matrix, a second region 820, and a third region 830.

The second region 820 on the screen 800 may display at least one longitudinal axis cross-sectional image 805 showing a cross-section on a longitudinal axis of the heart. The at least one longitudinal axis cross-sectional image 805 may correspond to one of a plurality of rows in the MR image matrix.

If a user selects an index ED representing a second column 801 that is an end-diastole column, the longitudinal axis cross-sectional image 805 corresponding to short-axis cross-sectional images contained in the second column 801 may be displayed on the second region 820.

Similarly, if the user selects an index ES representing a seventh column 803 that is an end-systole column, the longitudinal axis cross-sectional image 805 corresponding to short-axis cross-sectional images contained in the seventh column 803 may be displayed on the second region 820.

Similar to the exemplary embodiment shown in FIG. 7, positions 825 to 828 of slices corresponding to short-axis cross-sections represented by short-axis cross-sectional images contained in rows of an MR image matrix on the first region 810, respectively, may be indicated in the longitudinal axis cross-sectional image 805.

Images 831 and 833 obtained by enlarging at least one of the images in the MR image matrix may be displayed on the third region 830 on the screen 800. The image 831 may correspond to one of the images contained in the second column 801 that is an end-diastole column in the MR image matrix. Furthermore, the image 833 may correspond to one of the images contained in the seventh column 803 that is an end-systole column in the MR image matrix.

If the heart does not move properly due to abnormality in a function of the heart, the end-systole column 803 and the end-diastole column 801 may not be accurately displayed. In this case, the user may reposition an indicator identifying the end-systole or end-diastole column.

For example, when repositioning the indicator identifying the end-systole or end-diastole column, the user may input a hotkey (e.g., Alt+L) and drag the indicator identifying the end-systole column. Alternatively, the user may use a touch input to touch and drag the indicator identifying the end-systole column. The above-described user input method and hotkey are only examples for convenience of explanation, and are not limited thereto.

In another example, the user may move an indicator (e.g., index ED) identifying the second column 801 representing end diastole to a left direction 811 or a right direction 812. Similarly, the user may move an indicator (e.g., index ES) identifying the seventh column 803 representing end systole to a left direction 813 or a right direction 814.

In still another example, the user may reposition an indicator identifying end-systole or end-diastole column by selecting the indicator identifying end-systole and end-diastole column and dragging and dropping the indication thereof to a desired position.

If the user moves the index ED indicating that the second column 801 is an end-diastole column to the left direction 811 by, for example, dragging and dropping the index ED at the top of the first column 807, the index ED may be repositioned from the top of the second column 801 to the top of the first column 807.

Furthermore, when the user moves the index ED from the top of the second column 801 to the top of the first column 807 as described above, and if the longitudinal axis cross-sectional image 805 corresponding to short-axis cross-sectional images in the second column 801 is being displayed on the second region 820, the longitudinal axis cross-sectional image 805 displayed on the second region 820 may be modified accordingly. For example, the longitudinal axis cross-sectional image 805 displayed on the second region 820 may be modified simultaneously with the movement of the index ED. In other words, the longitudinal axis cross-sectional image 805 may be modified to a longitudinal axis cross-sectional image corresponding to short-axis cross-sectional images in the first column 807, according to the movement of the index ED.

Modification of a mark indicating a base or an apex of the heart will now be described in detail with reference to FIG. 9.

Figure 9:
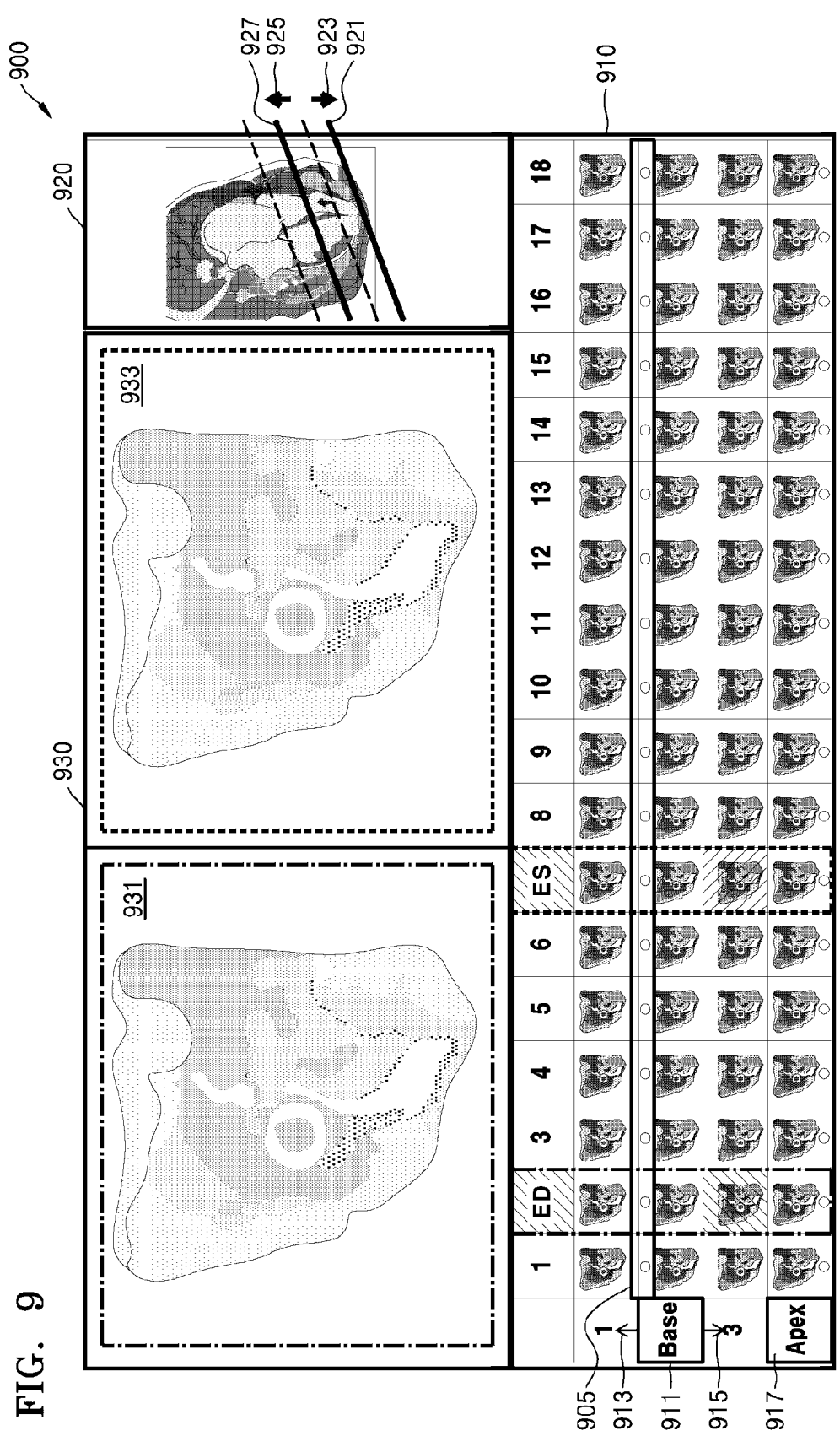
FIG. 9 illustrates a screen for processing a medical image according to still another exemplary embodiment.

FIG. 9 illustrates a screen 900 for processing a medical image according to still another exemplary embodiment.

Referring to FIG. 9, the screen 900 may be divided into a first region 910 for displaying an MR image matrix, a second region 920, and a third region 930.

The arrangement of images displayed in the first through third regions 910, 920, and 930 may be substantially the same or similar to those already described with respect to FIGS. 7 and 8 and thus descriptions thereof are omitted.

At least one of marks 921 and 927 respectively representing an apex and a base of the heart may be indicated on at least one longitudinal axis cross-sectional image that is displayed on the second region 920.

A user may modify a position of a mark indicating a base or apex of the heart in an MR image matrix displayed on the first region 910. The mark may move upward or downward based on a user input.

For example, as shown in FIG. 9, the user may move an index "Base" 911 representing a base row in an upward or downward direction 913 or 915 by dragging the index "Base" 911. In this case, a plurality of marks 905 indicating a base may be moved in the upward or downward direction 913 or 915 together with the index "Base" 911. Similarly, the user may move an index "Apex" 917 representing an apex row by dragging the index "Apex" 917. In this case, a plurality of marks indicating an apex may also be moved together with the index "Apex" 917.

In addition, when the user modifies positions of the marks 905 indicating the base or apex that are indicated in the MR image matrix displayed on the first region 910, positions of the marks 921 or 927 indicating the apex or base on the second region 920 may also be modified accordingly.

For example, by moving the index "Base" 911 representing the base row in the upward direction 913, the user may modify the positions of the marks 905 indicated on the base row. In this case, the mark 927 indicating the base on the second region 920 may also be moved in an upward direction 925 and displayed at a moved position.

The user may modify only the mark 921 or 927 indicating the apex or base on the second region 920, without modifying the marks 905 indicated on the base or apex row on the first region 910.

For example, if the user desires to modify the positions of the marks 921 and 927 respectively representing the apex and base of the heart, the user may modify the positions of the marks 921 and 927 by selecting the marks 921 and 927 and moving the marks 921 and 927 in downward and upward directions 923 and 925, respectively.

Similarly, if a user modifies the positions of the marks 921 and 927 on the second region 920, the positions of the marks 905 indicating the base or apex in the MR image matrix on the first region 910 may also be modified simultaneously with the modifications to the positions of the marks 921 and 927.

Since the heart moves dynamically when the heart is beating, positions of an apex or base of the heart on a longitudinal axis may vary over time. Thus, detecting positions of an apex and a base may not be accurate.

In this case, the user may not move the index "Base" 911 indicating the base row or the index "Apex" 917 indicating the apex row at the same time but needs to individually adjust the position of each of the indices 911 and 917 respectively indicating the base and apex.

Figure 10A:
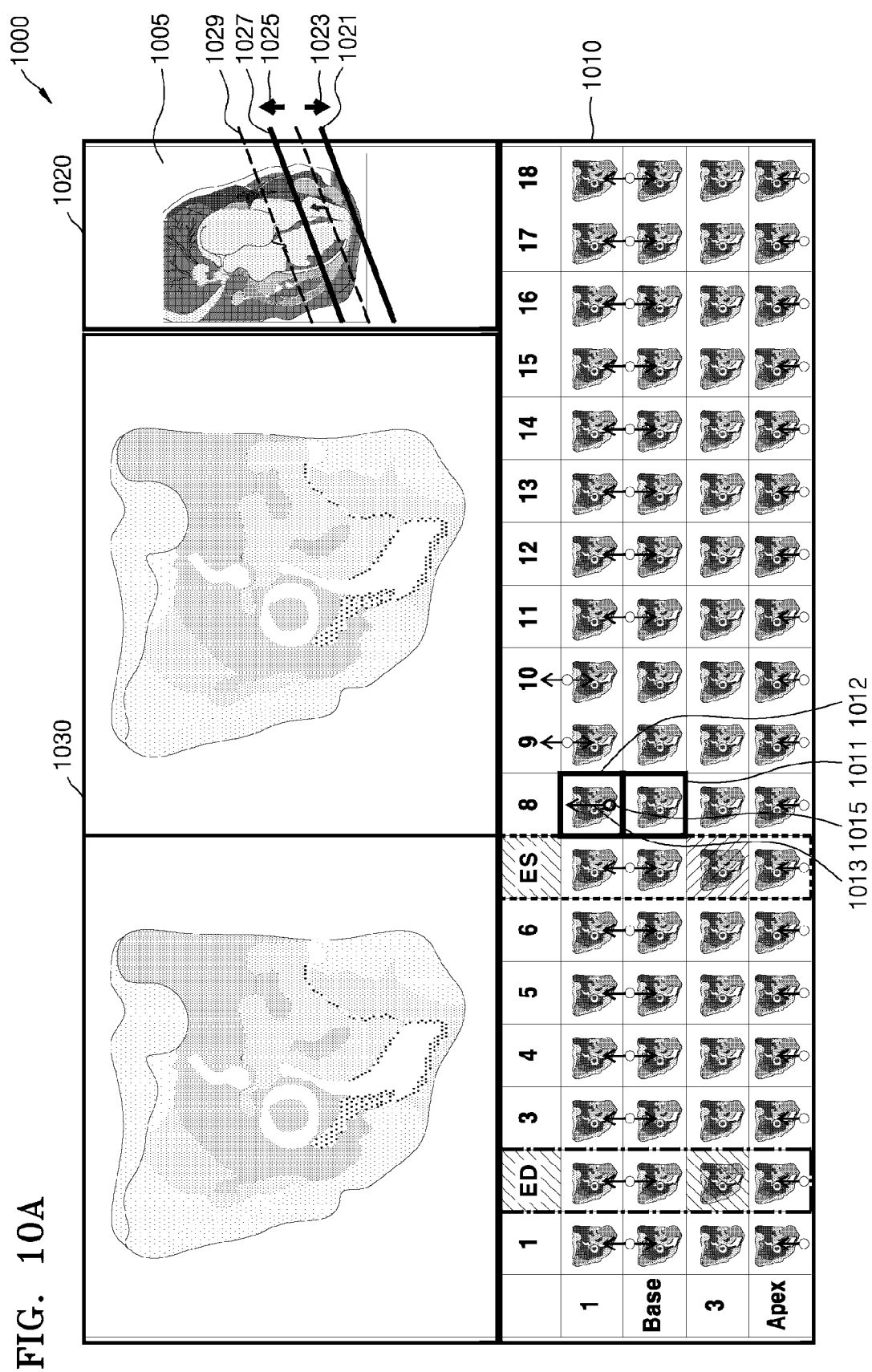
FIGS. 10A and 10B illustrate screens for processing a medical image according to still another exemplary embodiment.
Figure 10B:
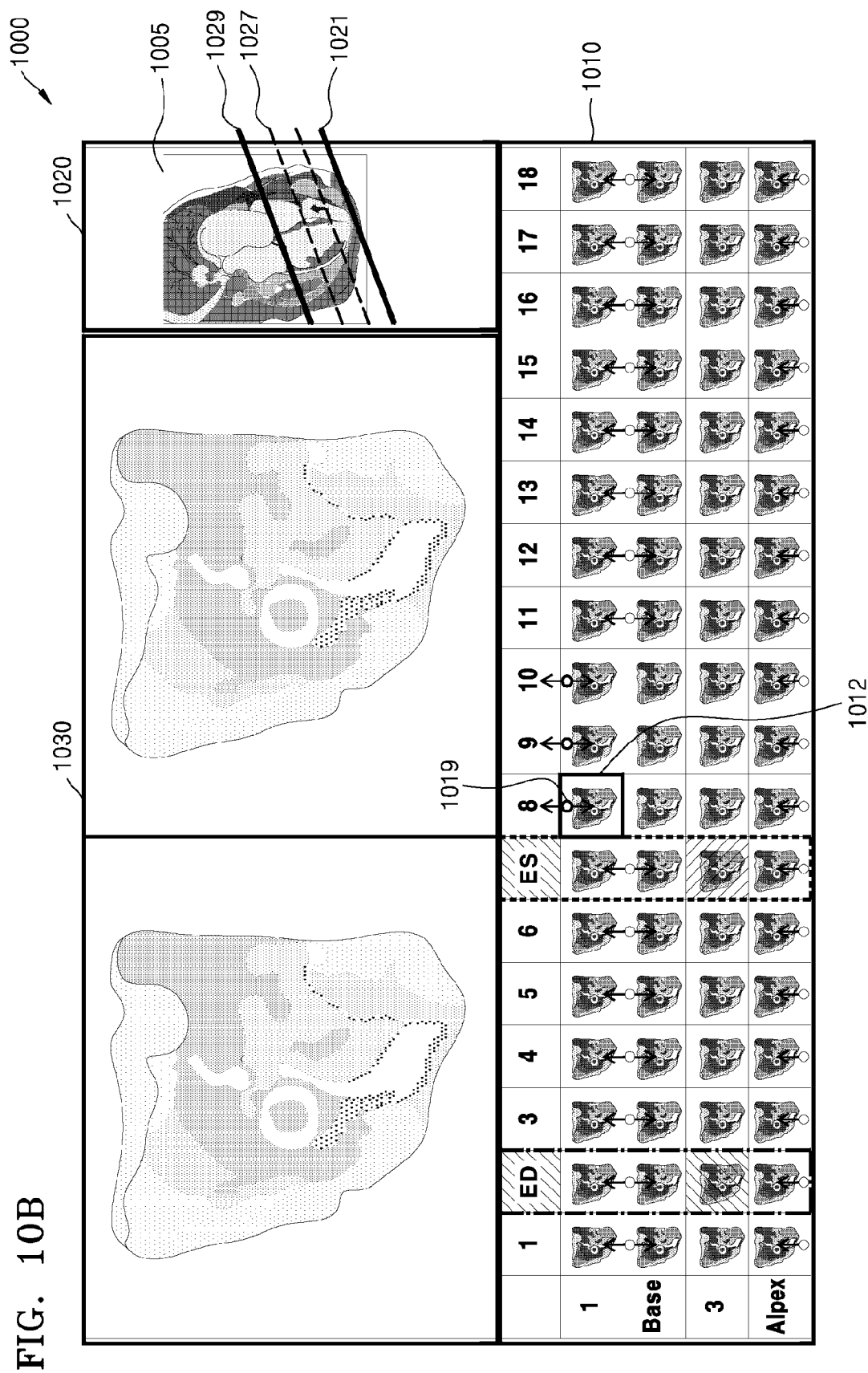

FIGS. 10A and 10B illustrate a screen 1000 for processing a medical image according to still another exemplary embodiment.

Referring to FIG. 10A, the screen 1000 may be divided into a first region 1010 for displaying an MR image matrix, a second region 1020, and a third region 1030.

Arrangement of images displayed on the screen 1000 may be substantially the same or similar to those already described with respect to FIGS. 7 through 9. Thus, repetitive descriptions are omitted, and only a difference from the arrangements shown in FIGS. 7 through 9 is described.

To modify marks indicating a base and apex, a user may select each of the marks and move the marks upward or downward. A user input for modifying the marks may include a hotkey input, a touch input, or a drag and drop input via an input unit, but is not limited thereto.

Referring to FIG. 10A, the user may select a mark 1015 indicating a base, move the mark 1015 in an upward direction 1013 from a short-axis image 1011, and place the mark 1015 on a short-axis image 1012 located at a first row and an eighth column.

As described above with reference to FIG. 9, if the user modifies the mark 1015 indicating the base on the first region 1010 by moving the mark 1015 from the short-axis image 1011 to the short-axis image 1012, a mark 1027 indicating a base on a longitudinal axis image 1005 displayed on the second region 1020 may also be modified simultaneously with the mark 1015. In other words, the mark 1027 may be moved in an upward direction 1025, and a mark 1029 may be displayed at a modified position.

Alternatively, the user may select and move a plurality of marks simultaneously using, for example, a hotkey.

FIG. 10B illustrates displaying of a mark 1019 indicating the base on the short-axis image 1012 that is placed at a first row and an eighth column by modifying the mark 1015 in FIG. 10A to the mark 1019 via a user input.

Referring to FIG. 10B, the screen 1000 shows that the mark 1019 is moved to the short-axis image 1012 placed at the first row and the eighth column on the first region 1010.

Furthermore, the mark 1029 indicating the base obtained by modifying the mark 1027 is indicated on the longitudinal axis image 1005 displayed on the second region 1020 of the screen 1000.

In a similar manner, the user may modify a mark indicating the apex as described above with reference to FIGS. 10A and 10B.

If the user desires to view an image indicated by a mark after modification, the user may enlarge at least one of images indicated by marks and display an enlarged version of image on the third region 1030. The user may also display images indicated by marks on the third region 1030 in a time sequential manner. According to an exemplary embodiment, the user may select the images indicated by the marks by, for example, clicking left and right buttons on a keyboard to be displayed on the third region 1030.

The exemplary embodiments may be written as computer programs and may be implemented in general-use digital computers that execute the programs using a computer-readable recording medium.

Examples of the computer-readable recording medium include magnetic storage media (e.g., read only memories (ROMs), floppy disks, hard disks, etc.), optical recording media (e.g., compact disc (CD)-ROMs, or digital versatile discs (DVDs)), etc.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A medical imaging apparatus comprising:
a magnetic resonance imaging (MRI) system that performs MRI on a heart and obtains a plurality of magnetic resonance (MR) images;
an output circuitry configured to display, on a first region of a screen, an MR image matrix in which the plurality of MR images are arranged in columns and rows; and
an image processor configured to display at least one first indicator which indicates a column of the MR image matrix corresponding to at least one of end diastole and end systole and display at least one second indicator which indicates a row of the MR image matrix corresponding to at least one of an apex and a base of the heart,
wherein the columns of the MR image matrix are arranged according to time when MR images included in the columns are captured, and the rows of the MR image matrix are arranged according to a position on a longitudinal axis of the heart, the position corresponding to MR images included in the rows,
wherein the output circuitry is configured to display, on a second region of the screen, at least one first cross-sectional image on the longitudinal axis of the heart,
wherein the image processor is configured to display marks on the at least one first cross-sectional image displayed on the second region, the marks indicating positions, on the longitudinal axis of the heart, respectively corresponding to the rows of the plurality of MR images included in the MR image matrix, and
wherein the output circuitry is configured to reposition the marks, based on a user input for repositioning the marks.

2. The apparatus of claim 1, wherein the plurality of MR images comprise second cross-sectional images on a lateral-axis of the heart, the longitudinal axis being perpendicular to the lateral-axis of the heart.

3. The apparatus of claim 2,
wherein the at least one first cross-sectional image corresponds to the at least one of the end diastole and the end systole.

4. The apparatus of claim 3, further comprising:
an input circuitry configured to receive a user input for repositioning the at least one first indicator which indicates the column of the MR image matrix corresponding to the at least one of the end diastole and the end systole,
wherein the output circuitry is configured to reposition, based on the user input for repositioning the at least one first indicator, the at least one first indicator.

5. The apparatus of claim 4, wherein the output circuitry is configured to change the at least one first cross-sectional image displayed on the second region, based on the user input for repositioning the at least one first indicator.

6. The apparatus of claim 4, wherein the at least one first indicator comprises an index for identifying at least one of an end-diastole column of the MR image matrix corresponding to the end diastole and an end-systole column of the MR image matrix corresponding to the end systole, and
wherein the user input for repositioning the at least one first indicator comprises dragging the index for identifying the at least one of the end-diastole column and the end-systole column.

7. The apparatus of claim 1, further comprising an input circuitry configured to receive the user input for repositioning the marks.

8. The apparatus of claim 7, wherein the user input for repositioning the marks comprises a drag input.

9. The apparatus of claim 1, wherein the plurality of MR images included in the MR image matrix comprise MR images captured during a single cardiac cycle, and MR images in a row of the MR image matrix are captured at the same position on a lateral-axis of the heart at predetermined time intervals.

10. The apparatus of claim 1, wherein the output circuitry is configured to enlarge at least one MR image, among the plurality of MR images in the MR image matrix, and display the enlarged at least one MR image on a third region of the screen.

11. A method of processing a medical image, the method comprising:
performing magnetic resonance imaging (MRI) on a heart using an MRI system and obtaining a plurality of magnetic resonance (MR) images;
displaying, on a first region of a screen, an MR image matrix in which the plurality of MR images are arranged in columns and rows;

displaying at least one first indicator which indicates a column of the MR image matrix corresponding to at least one of end diastole and end systole; and displaying at least one second indicator which indicates a row of the MR image matrix corresponding to at least one of an apex and a base of the heart, wherein the columns of the MR image matrix are arranged according to time when MR images in the columns are captured, and the rows of the MR image matrix are arranged according to a position on a longitudinal axis of the heart, the position corresponding to MR images included in the rows, wherein the method further comprises:

displaying, on a second region of the screen, at least one first cross-sectional image on the longitudinal axis of the heart, displaying marks on the at least one first cross-sectional image displayed on the second region, the marks indicating positions, on the longitudinal axis of the heart, respectively corresponding to the rows of the plurality of MR images included in the MR image matrix, and receiving a user input for repositioning the marks and repositioning the marks based on the user input for repositioning the marks.

12. The method of claim 11, wherein the plurality of MR images comprise second cross-sectional images on a lateral-axis of the heart, the longitudinal axis being perpendicular to the lateral-axis of the heart.

13. The method of claim 12, wherein the at least one first cross-sectional image corresponds to the at least one of the end diastole and the end systole.

14. The method of claim 13, further comprising:
receiving a user input for repositioning the at least one first indicator which indicates the column of the MR image matrix corresponding to the at least one of the end diastole and the end systole; and repositioning, based on the user input for repositioning the at least one first indicator, the at least one first indicator.

15. The method of claim 14, further comprising:
changing the at least one first cross-sectional image displayed on the second region, based on the user input for repositioning the at least one first indicator.

16. The method of claim 14, wherein the displaying the at least one first indicator comprises displaying an index for identifying at least one of an end-diastole column of the MR image matrix corresponding to the end diastole and an end-systole column of the MR image matrix corresponding to the end systole, and wherein the user input for repositioning the at least one first indicator comprises a drag input on the index for identifying the at least one of the end-diastole column and the end-systole column.

17. The method of claim 11, wherein the user input for repositioning the marks comprises a drag input.

18. The method of claim 11, wherein the plurality of MR images included in the MR image matrix comprise MR images captured during a single cardiac cycle, and MR images in a row of the MR image matrix are captured at the same position on a lateral-axis at predetermined time intervals.

19. The method of claim 11, further comprising:
enlarging at least one MR image, among the plurality of MR images in the MR image matrix, and displaying the enlarged at least one MR image on a third region of the screen.

20. A non-transitory computer-readable recording medium having recorded thereon a program, which, when executed by a computer, causes the computer to execute the method of claim 11.

* * * * *